Figure 1:
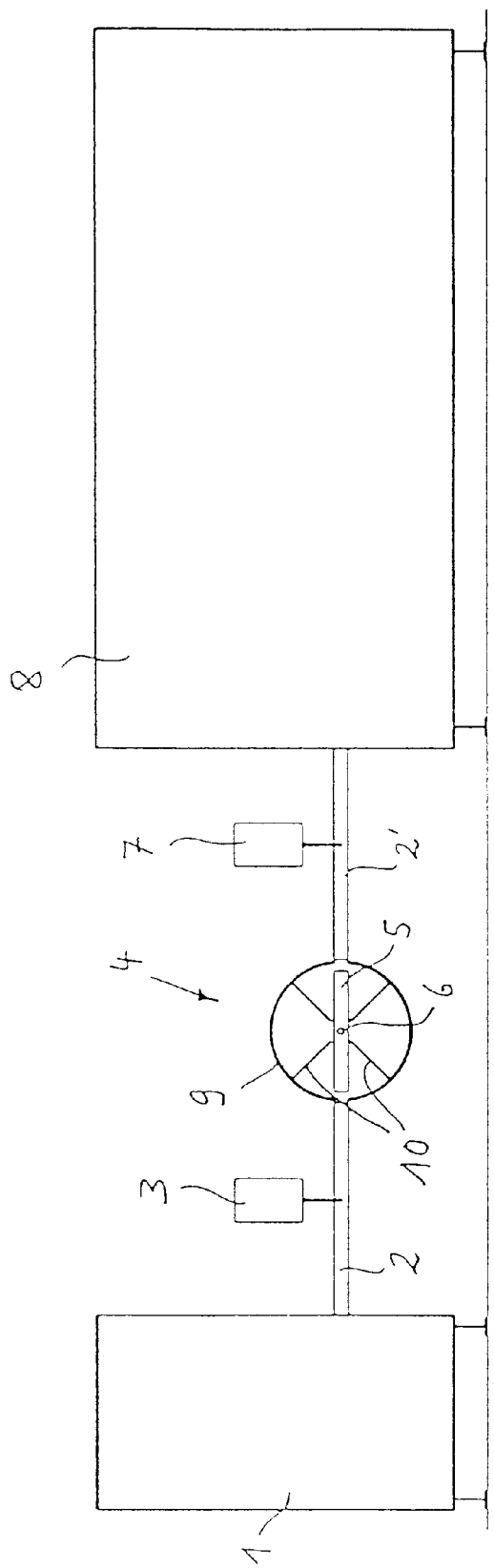

United States Patent
Kuster

[11] Patent Number: 6,063,191
[45] Date of Patent: May 16, 2000

[54] APPARATUS FOR THE COATING OF FLAT-FORM SUBSTRATES ESPECIALLY OF PRINTED CIRCUIT BOARDS

[75] Inventor: Kaspar Kuster, Therwil, Switzerland

[73] Assignee: Ciba Specialty Chemicals Corp., Tarrytown, N.Y.

[21] Appl. No.: 09/060,690

[22] Filed: Apr. 15, 1998

[30] Foreign Application Priority Data

Apr. 24, 1997 [EP] European Pat. Off. ............. 97106808

[51] Int. Cl.$^7$ ................ B05C 1/00; B05C 5/00; B08B 3/00; B25J 3/00
[52] U.S. Cl. ............ 118/218; 118/314; 118/319; 118/503; 118/630; 134/62; 134/64 R; 134/131; 134/902; 414/758; 414/761; 414/763
[58] Field of Search .................... 118/314, 218, 118/319, 503, 630; 134/62, 64 R, 131, 902; 271/184, 185, 186, 187, 315; 414/758, 759, 760, 761, 762, 773, 763

[56] References Cited

U.S. PATENT DOCUMENTS

| | | | |
|---|---|---|---|
| 3,610,397 | 10/1971 | Bok | 198/33 |
| 4,854,081 | 8/1989 | Pola et al. | 51/76 R |
| 5,221,347 | 6/1993 | Heine | 118/630 |
| 5,259,495 | 11/1993 | Douglas | 198/404 |
| 5,297,568 | 3/1994 | Schmid | 134/62 |
| 5,326,179 | 7/1994 | Fukai et al. | 400/120 |
| 5,732,623 | 3/1998 | Compera et al. | 101/232 |
| 5,768,143 | 6/1998 | Fujimoto | 364/479.05 |
| 5,806,999 | 9/1998 | Kobayashi | 400/188 |
| 5,927,713 | 7/1999 | Driscoll et al. | 271/298 |

FOREIGN PATENT DOCUMENTS

| 0504656 | 9/1992 | European Pat. Off. . |
|---|---|---|
| 0637561 | 2/1995 | European Pat. Off. . |

*Primary Examiner*—Curtis Mayes
*Assistant Examiner*—J. A. Lorengo
*Attorney, Agent, or Firm*—Michele A. Kovaleski

[57] ABSTRACT

An apparatus for the coating of flat-form substrates, especially of printed circuit boards, solder masks and the like, wherein there is arranged between two coating stations a turning station for the printed circuit boards, which are conveyed on a transporter pathway through the coating stations and the turning station, wherein in the turning station (4) there are provided in the same plane as the incoming transporter pathway (2) receiving elements (5) located, spaced apart, opposite one another, which enter into engagement with the edge of a printed circuit board (11) or a holding element attached to the printed circuit board, it being possible to pivot those receiving elements (5) through 180° so that, when the printed circuit board is discharged, they again lie in the plane of the onwards-leading transporter pathway (2').

12 Claims, 3 Drawing Sheets

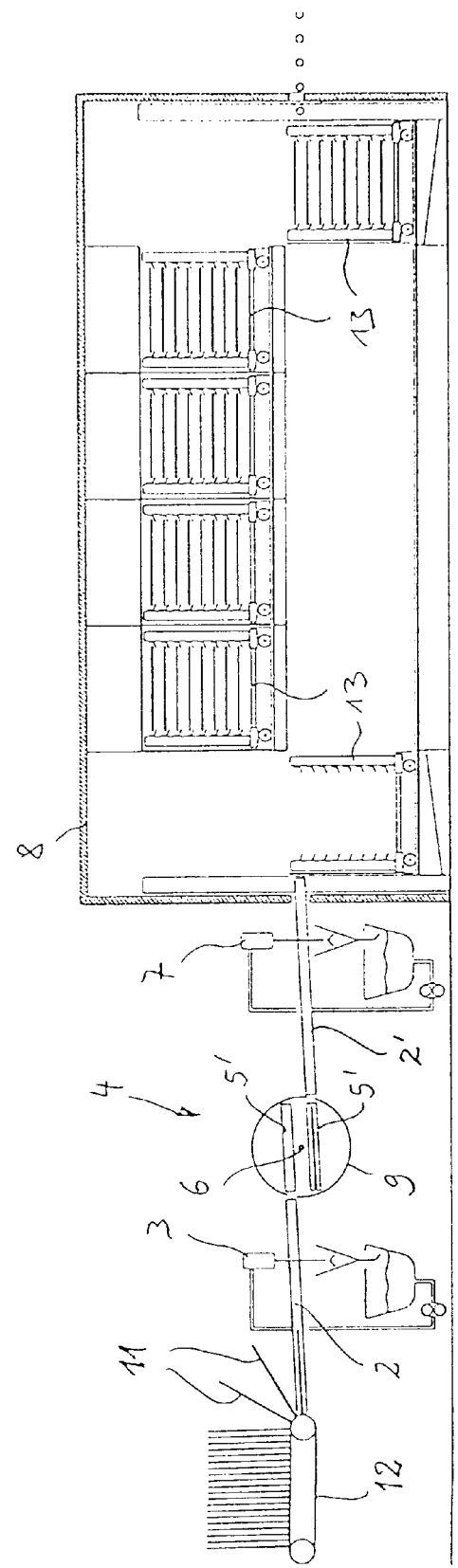

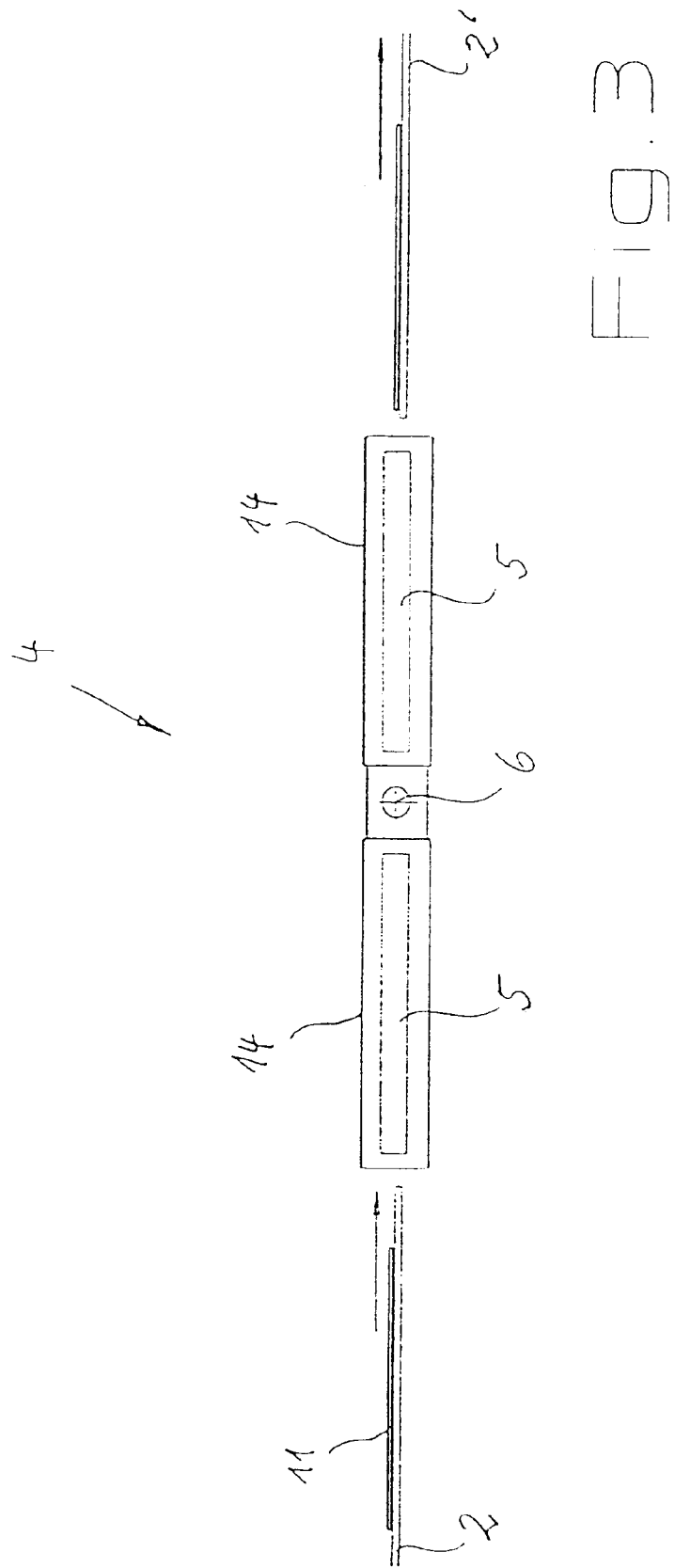

APPARATUS FOR THE COATING OF FLAT-FORM SUBSTRATES ESPECIALLY OF PRINTED CIRCUIT BOARDS

The invention relates to an apparatus for the coating of flat-form substrates, especially of printed circuit boards, solder masks and the like, wherein the printed circuit boards are conveyed through a first coating station for the coating of one side of the printed circuit board, are then turned over and are conveyed through a second coating station for the coating of the other side of the printed circuit board.

From EP 0 586 772 it is known, for the purpose of coating both sides of printed circuit boards, to convey the printed circuit boards, after they have passed through a first coating station, into an airflow dryer, in which the printed circuit boards are inserted into special holding elements, which are fastened to a vertically circulating chain. In that arrangement, the printed circuit boards are turned over after the chain has turned around an upper chain wheel and are conveyed downwards again, after which the printed circuit boards are conveyed out of the airflow dryer and through a second coating station, in which the second side (now the upper side) of the printed circuit boards is coated. In that known form of construction, after the second side has been coated, the printed circuit boards must be introduced into an airflow dryer again, in order that the second side be treated in the same manner as the first, previously coated side. That construction, as a result of the arrangement of the airflow dryer, together with the chain conveyor, downstream of each coating station, takes up a relatively large amount of room.

The invention is based on the problem of constructing an apparatus of the type mentioned at the beginning such that a coating installation of compact construction is obtained.

The problem is solved according to the invention by the features of claim 1. As a result of gripping a printed circuit board by the edges in the turning station and turning it over by rotation through 180°, coating of the two sides can be carried out in quick succession so that the necessary treatment of the coated printed circuit board, such as airflow treatment, drying and cooling, can be performed for both coated sides simultaneously in a treatment zone located downstream. The turning station itself can be made very compact and, as a result of there being a common treatment zone for both coated sides of a printed circuit board, the installation as a whole has a very space-saving construction.

By way of example, the invention is illustrated in greater detail with reference to the drawing, in which FIG. 1 shows, in a diagrammatic side view, a coating installation;

FIG. 2 shows, in the same view, a modified embodiment of the turning station; and FIG. 3 shows, in a diagrammatic view, a further embodiment of the turning station.

In FIG. 1, the reference numeral 1 designates a preheating station, from which a transporter pathway 2 for the printed circuit boards (not illustrated in FIG. 1) leads through a first coating station 3, in which the upper side of a printed circuit board on the transporter pathway 2 is provided with a surface coating layer or a layer of plastics material. The coating station 3 is so constructed that the edges of a printed circuit board that are parallel to the direction of transport or a holding element attached to those edges or a frame holding the printed circuit board are/is kept free of coating material. In a coating device that operates using a pouring curtain, that can be accomplished by limiting the pouring curtain laterally.

The first coating station 3 is followed by a turning station 4 which, in the embodiment according to FIG. 1, comprises elongate receiving elements 5 arranged in the plane of the transporter pathway 2 and located opposite one another across the width of the transporter pathway 2 and which enter into engagement with the edge of a printed circuit board or with holding elements or frame portions thereof. Those receiving elements 5 can be pivoted about an axis 6, which in the illustrated embodiment is approximately in the centre of the receiving elements 5 transverse to the direction of transport.

The receiving elements 5 can be constructed, for example, in the form of rails of U-shaped cross-section having clamping elements or in the form of rods having gripping devices mounted thereon, the gripping devices gripping the uncoated edge of a printed circuit board.

After a printed circuit board has been taken up in the receiving elements 5, the latter are pivoted in one movement through 180° about an axis 6 so that the receiving elements 5 align with the onwards-leading transporter pathway 2', with the result that the turned-over printed circuit board can be transferred onto the transporter pathway 2', which leads through a second coating station 7 advantageously constructed in the same manner as the first coating station 3.

At least the second transporter pathway portion 2', which leads away from the turning station 4, is so arranged that, on the transporter pathway also, only the edges of the printed circuit board come into contact with the transport device so that the lower, coated side of the printed circuit board remains exposed. Such transport devices, in which only the edge of a printed circuit board is gripped, are known per se. When very thin printed circuit boards are to be coated, it is preferable to use a holding element that is attached along the side edges extending in the direction of transport or a frame surrounding the printed circuit board so that the transport device does not come into contact with the printed circuit board itself, but rather only holding elements or frame portions thereof are gripped.

After the second coating station 7, the transporter pathway 2 leads into a treatment installation 8, in which the coated printed circuit boards are subjected to various treatment processes.

In order that turning over the printed circuit board does not result in a large amount of air turbulence that could have an adverse effect on the coating applied shortly beforehand, the receiving elements 5 are preferably surrounded by a drum 9, inside which a printed circuit board is turned over. The drum 9 can be arranged to be stationary, with only the receiving elements 5 being pivoted inside the drum 9, or the drum 9 can be rotated about the axis 6 together with the receiving elements 5.

In the embodiment having the rotating drum 9, there can advantageously be provided entraining elements 10 projecting radially inwards from the drum, for example gratings or panels, which, during the turning process, entrain the air enclosed in the drum, so that the movement of air inside the drum relative to the printed circuit board is kept to a minimum.

Even when a printed circuit board remains in the turning station 4 for only a relatively short time, it is still possible to carry out interim treatment of the printed circuit board in the drum 9 by providing, for example, infra-red heating in, or on, the drum, by means of which the applied coating can be pre-dried.

By virtue of the fact that the volume of air within the drum 9 is largely enclosed, it is also possible to create clean-room conditions inside the drum between loading and unloading of the turning station 4 by the upstream connection of a filter and a separate air supply.

The drum 9 is provided with inlet and outlet slots (not illustrated in greater detail) in the axial direction for the purpose of taking up and discharging the printed circuit boards.

In a simple practical form of the receiving elements 5, they can consist of ribs arranged approximately in a V-shape, on which the uncoated edge of a printed circuit board rests. Limiting elements or stops can also be provided in the receiving elements of V-shaped cross-section in order to fix the position of a printed circuit board in the receiving elements 5 before the printed circuit board is turned over. Those stops can be extended and retracted by means of appropriate control elements.

FIG. 2 shows a modified embodiment of the coating installation, wherein printed circuit boards 11 are deposited on the transporter pathway 2 individually by an unstacking device 12. The two coating stations 3 and 7 are shown, in a diagrammatic representation, in the form of pouring stations discharging a pouring curtain of coating material, through which the printed circuit boards 11 are conveyed.

The treatment installation 8 downstream of the second coating station 7 has pallet trolleys 13, in which the printed circuit boards can be stacked, spaced apart, one above the other, after which the individual pallet trolleys are conveyed through separate treatment chambers.

The turning station 4 in this embodiment is constructed having two pairs of receiving elements 5' located essentially parallel to one another, with the pivot axis 6 being located in the middle between the two receiving elements 5' and, for example, the upper receiving element 5' being in alignment with the incoming transporter pathway 2 while the receiving element arranged therebelow is in alignment with the onwards-leading transporter pathway 2', which is located in a different plane to that of the transporter pathway 2 upstream of the turning station 4.

This practical form enables a printed circuit board 11 coming from the first coating station 3 to be taken up in the turning station 4 while a printed circuit board that has already been turned over is deposited onto the second portion 2' of the transporter pathway. As a result, the capacity of the coating installation can be doubled.

Whereas the transporter pathway 2 extends substantially horizontally in the embodiment according to FIG. 1, it is arranged inclined in the form of construction according to FIG. 2, the first portion of the transporter pathway being arranged inclined at a certain angle to the horizontal and the upper receiving element 5' assuming the same inclination relative to the horizontal. The second portion 2' of the transporter pathway is also arranged inclined in the same way.

Inclination of the transporter pathway 2 at an angle of up to 45° to the horizontal can be advantageous for the coating, in order that holes provided in the printed circuit boards are kept as free of surface coating as possible. That can be assisted by causing air to flow over the printed circuit boards during the coating process. By being constructed in the form of pivotable, elongate receiving elements 5, the turning station 4 can, by adjusting the position in which it comes to a stop, be adapted to any desired angle of the transporter pathway 2.

FIG. 3 shows a modified embodiment in which pairs of receiving elements 5 are arranged on both sides of the pivot axis 6 in the turning station 4, the left-hand receiving element 5 in FIG. 3 taking up a printed circuit board 11 while the receiving element located opposite discharges a printed circuit board.

In the embodiment according to FIG. 3, there is provided instead of a drum 9 a cassette 14, into which a printed circuit board 11 is introduced and in which the printed circuit board is taken up by the receiving elements 5, after which the cassette 14 is pivoted through 180° about the pivot axis 6. As a result, the volume of air in the cassette 14 that surrounds the printed circuit board 11 during turning is reduced to a minimum. On the surfaces of the cassette there can be provided, for example, a heating device.

Various modifications of the described embodiments are possible. In the embodiment according to FIG. 3 also, a drum can be provided around the receiving elements 5 instead of the two cassettes, as shown diagrammatically in FIGS. 1 and 2, although in the form of construction according to FIG. 3 the drum will have a larger diameter because the printed circuit boards are arranged next to one another, not above one another.

Instead of radially disposed entraining elements 10 for the air enclosed in the drum, it is also possible to provide, inside the drum, covering elements disposed approximately parallel to the surface of the printed circuit board, which correspond to the outer surfaces of a cassette 14.

When a cassette 14 is used, the pivot axis 6 can also be in the region of the cassette 14, as is the case with the form of construction according to FIG. 1. In the embodiment according to FIG. 2 also, two cassettes 14 located above one another, together with the receiving elements 5, can be provided instead of a drum 9.

The inclination of the transporter pathway 2 upstream and downstream of the turning station 4 can also be made adjustable, as can the position in which the turning station 4 itself comes to a stop, so that the turning station 4 can be adapted to different inclinations of the transporter pathway.

The receiving elements 5 are preferably made adjustable with regard to the distance between them so that the turning station 4 can be adapted to different widths of printed circuit boards 11 being coated. In conjunction with a coating station that operates using a pouring curtain where the width of the pouring curtain can be set according to the printed circuit board being coated, the distance between the receiving elements 5 transverse to the direction of transport is preferably linked to the adjustment of the width of the pouring curtain so that when the pouring curtain is adjusted the receiving elements 5 in the turning station 4 are automatically adjusted also.

In all the embodiments, only one printed circuit board at a time is located in the turning station 4 during turning. For that reason, a pivot axis 6 located in the central region of the receiving elements 5, as shown in FIGS. 1 and 2, is preferred.

In the embodiments according to FIGS. 2 and 3, the receiving elements 5 can be made closed at one end because a printed circuit board cannot be conveyed through the receiving elements. In the embodiment according to FIG. 1, the receiving elements are preferably made open at both ends and so arranged that a printed circuit board can be conveyed through the turning station when only one side of a printed circuit board is to be coated. In that arrangement, the turning station 4 can be so connected that it forms merely an intermediate portion of the transporter pathway 2 and does not carry out a turning operation.

The same conditions are applied to both sides of a printed circuit board when printed circuit boards 11 that are coated on both sides are being treated downstream, because the coating of the two sides is carried out in quick succession.

The described apparatus is especially suitable for the transportation of thin printed circuit boards and/or foils.

What is claimed is:

1. An apparatus for the coating of flat-form substrates, wherein there is arranged between two coating stations a turning station for the substrates, which are conveyed on a transporter pathway through the coating stations and the turning station, wherein in the turning station (4) there are provided in the same plane as the incoming transporter pathway (2) receiving elements (5) located, spaced apart, opposite one another, which enter into engagement with the edge of a substrate (11) or a holding element attached to the substrate, it being possible to pivot those receiving elements (5) through 180° so that, when the substrate is discharged, they lie in the plane of the onwards-leading transporter pathway (2'), and wherein the turning station (4) is surrounded by a covering means (9; 14), by which the volume of air in the covering means is enclosed to avoid air turbulence during turning operation.

2. An apparatus according to claim 1, wherein the receiving elements (5) are surrounded by a drum (9).

3. An apparatus according to claim 2, wherein the drum (9) can be rotated together with the receiving elements (5).

4. An apparatus according to claim 3, wherein there are provided in the drum (9) entraining elements (10) for the air enclosed in the drum.

5. An apparatus according to claim 2, wherein a device for interim treatment of the printed circuit boards (11) is attached to the drum (9).

6. An apparatus according to claim 1, wherein said receiving elements (5) are arranged in the plane comprising a pivot axis (6).

7. An apparatus according to claim 1, wherein two pairs of receiving elements (5') located parallel to one another are provided above one another, one pair of which is in alignment with the incoming transporter pathway and the other pair of which is in alignment with the onwards-leading transporter pathway in the taking-up and discharging position, respectively.

8. An apparatus according to claim 1, wherein the transporter pathway (2) is arranged inclined to the horizontal and the receiving elements (5) of the turning station (4) are arranged at a corresponding angle of inclination in the loading and unloading positions.

9. An apparatus according to claim 1, wherein the distance between the receiving elements (5) located opposite one another is adjustable.

10. An apparatus according to claim 1, wherein the receiving elements (5) are provided with gripping devices.

11. An apparatus according to claim 1, wherein the receiving elements (5) are arranged in a cassette (14), which is pivotable.

12. An apparatus according to claim 1, wherein the flat-form substrate is a printed circuit board or a solder mask.

* * * * *